United States Patent [19]
Hase

[11] Patent Number: 5,132,872
[45] Date of Patent: Jul. 21, 1992

[54] LOW PROFILE MOUNTING ASSEMBLY AND CABINET ENCLOSURES FOR RACK RELAY MOUNTED RECTIFIERS

[76] Inventor: Alfred M. Hase, 390 Tapscott Rd., #5, Scarborough, Ontario, Canada, M1B 2Y9

[21] Appl. No.: 600,704

[22] Filed: Oct. 22, 1990

[51] Int. Cl.⁵ .............................................. H05K 7/20
[52] U.S. Cl. ........................................ 361/383; 320/2; 361/390; 361/395
[58] Field of Search ............... 320/2; 336/59; 361/380, 361/383, 384, 386, 388, 390, 395, 399

[56] References Cited
U.S. PATENT DOCUMENTS

| | | | |
|---|---|---|---|
| 3,857,044 | 12/1974 | Papoi et al. | 361/383 |
| 3,991,356 | 11/1976 | Spiteri | 320/2 |
| 4,365,288 | 12/1982 | Robe et al. | 361/384 |

Primary Examiner—Gregory D. Thompson
Attorney, Agent, or Firm—Donald E. Hewson

[57] ABSTRACT

An enclosure or cabinet is provided for single phase rectifiers that has a very low profile, low noise, efficient cooling, low temperature rise, and which is competitive with switch-mode technology rectifiers. The rack includes a chassis which is very strong and that has a horizontal base and a rear vertical wall secured to each other, and all of the components are mounted to the base or rear wall, or to components already mounted, with the single exception of a supervisory control panel which is mounted on the door panel that has been hinged to the front edge of the base. Light-weight sheet metal side walls and cabinet cover may be formed as a hood and placed over the assembled components to close the enclosure. A UI transformer and an EI saturable reactor are each mounted to the rear wall of the chassis, one above the other, and are wound in such a way that adequate air spaces exist between the coils on the core legs. Generally the UI transformer is also supported from the base. Cooling slots are formed in the horizontal base and vertical rear wall, in the cabinet side walls, and may also be formed in the cabinet top cover. All electrical connections are made at the front of the cabinet, thereby assuring easier assembly, using less material and with less chance for mistakes to be made.

5 Claims, 2 Drawing Sheets

LOW PROFILE MOUNTING ASSEMBLY AND CABINET ENCLOSURES FOR RACK RELAY MOUNTED RECTIFIERS

FIELD OF THE INVENTION

This invention relates to cabinet enclosures for single phase rectifiers used for telecommunications industry and the like, where the cabinet has a significantly lower profile than previously, and where the assembly is such that there is efficient cooling and audible low noise from the magnetic AC components mounted in the cabinet. The cabinet may, of course, be adapted for relay rack mounting, particularly when used in telecommunications applications. Cabinet enclosures in keeping with this invention are of a size not dissimilar to those used with switch-mode technology rectifiers. On the other hand, the present invention now provides rectifiers using linear technology, and thereby having much higher reliability than switch-mode technology rectifiers, but capable of fitting in the same general mounting environment with possibly restricted dimensions as to allowable cabinet enclosure height.

BACKGROUND OF THE INVENTION

The telecom industry requires significant numbers of single phase rectifiers. Usually, single phase rectifiers operate from 120 volts, 240 volts, or 208 volts AC input, with 12 volts, 24 volts, or 48 volts DC output. The current output may be as much as 125 or 150 amperes, at any of those DC voltage ratings.

The prior art has generally provided rack mounted cabinets for mounting in 19 inch or 23 inch relay racks. The cabinets have generally been quite large, and the industry has always prepared its cabinets in such a manner that the cabinets are first built and assembled except for their front cover, which is often assembled to the cabinet but hingedly opened; and the components of the single phase rectifier are then assembled into the cabinet. An industry standard for low frequency magnetic regulated single phase rectifiers operating at 48 volts and 100 amperes has been for a 19 inch relay rack cabinet to be 35 to 42 inches high. By the present invention, an equivalent rated single phase rectifier is mounted in a 19 inch relay rack cabinet that is only 17.5 inches high. Moreover, in keeping with the present invention, single phase rectifiers assembled as described hereafter have more efficient cooling, lower temperature rise and lower audible noise than such previous units of equivalent rating.

The present inventor has analyzed the assembly of prior art devices, and has determined that a number of factors can be significantly improved. They include the matter of physical assembly into a cabinet, which requirement has been obviated by the present invention; the matter of wiring to be assembled and put into place as the electrical components are assembled into the cabinet, requiring a significant amount of wire and other material and providing greater chances for error to occur, a matter that once again has been obviated; the use of transformer and saturable reactor designs that are inherently quite noisy, a matter that once again has been obviated by the present invention; and the problems of inadequate cooling air flow through the cabinet, once again being a matter that is obviated by the present invention.

Turning first to the cabinet design itself, it has been determined that if a strong chassis comprising a horizontal base and a vertical rear wall is assembled, where the material of the base and rear wall are strong and heavy enough to carry all of the loads that may be placed upon them by the components mounted to them and by the relay rack mounting of the unit, then it is not necessary for the cabinet structure—at least the side walls and the cabinet top cover—to be other than physical barriers protecting the components mounted within the enclosure. The front door panel may also be of significantly lower weight and thickness construction, because generally only a supervisory control panel is mounted to it.

The use of advanced design of magnetics and their mounting—particularly of the input transformer and the saturable reactor which are physically quite large—reduces the audible noise of the single phase rectifier. In particular, the present invention contemplates that the input transformer has a UI structure rather than the more usual EI structure; whereas the saturable reactor may have an EI core type structure rather than the usual EI shell type structure. In any event, the air spaces are provided around all of the windings mounted on the core legs to allow for adequate flow of cooling air.

In particular, by the provision of an adequate spacing between the windings mounted on the legs of the lower mounted UI input transformer, air flow can be induced upwardly past the transformer to cool the saturable reactor, diode assembly and other components. Indeed, since the flow of air is convection flow, the cooling is adequate and there is no necessity for forced air cooling in enclosures for single phase rectifiers according to the present invention. The cooling air is directed at and through the components to be cooled, so temperature rise within the cabinet enclosure is minimized.

By properly mounting the components of the single phase rectifier, all electrical wiring connections can be brought out to the front of the assembly. The components can, for the most part, be mounted first and thereafter the electrical wiring connections can be made. This reduces the chance for error to occur, and surprisingly also reduces the amount of material being used. The electronic circuitry of the single phase rectifier is not a subject of the present invention. Typical patents for battery chargers in the name of the present inventor are U.S. Pat. Nos. 4,320,333 issued Mar. 16, 1982 and 4,399,396 issued Aug. 16, 1983.

SUMMARY OF THE INVENTION

The present invention therefore provides an enclosure for single phase rectifiers (which may also be adapted for use with small inverters and AC line regulators) where within the enclosure there will be mounted an input transformer, a saturable reactor, at least one capacitor, input diodes, and other circuit components, all of which are to be physically mounted within the enclosure and are suitably electrically connected. The enclosure comprises a chassis having a horizontal base and a vertical rear wall secured to each other so as to form a rigid two-sided frame. A door panel is hingedly secured to the front edge of the horizontal base; and removable cabinet side walls and a cabinet top cover are arranged to be placed with the chassis and door panels so as to close the enclosure.

It has been found especially useful by the present inventor, and is provided in this invention, that the transformer is horizontally supported from the base. This feature in effect constitutes a gusset between the rear wall and the base of the chassis, and results in very low audible noise poduction—in the order of 50 dBA. The transformer is suitably formed with a UI-shaped core having two legs that project forwardly from the rear wall and a transformer coil mounted on each leg. The coils are mounted on the core legs so as to ensure that there is adequate spacing between the coils.

The saturable reactor is also securely mounted to the vertical rear wall of the chassis, horizontally above the input transformer. It is formed having an EI-shaped core with three legs projecting forwardly from the rear wall, and a reactor coil mounted on each leg. Once again, it is assured that there is an adequate air space between adjacent reactor coils on the core legs.

For circuit operation purposes, there is always at least one capacitor in the circuit mounted to the horizontal base. All other circuit components may be secured to the chassis, or to the transformer or the saturable reactor, and the mounting of the components is such that all input and output electrical connections, and indeed nearly all connections of the various circuit components, are made at the front of the enclosure. Cooling slots are provided at least in the horizontal base and the vertical rear wall of the chassis, and at least in the cabinet top cover or sides (usually both).

BRIEF DESCRIPTION OF THE DRAWINGS

The invention will be described in greater detail hereafter, in association with the accompanying drawings, in which.

Figure 1:
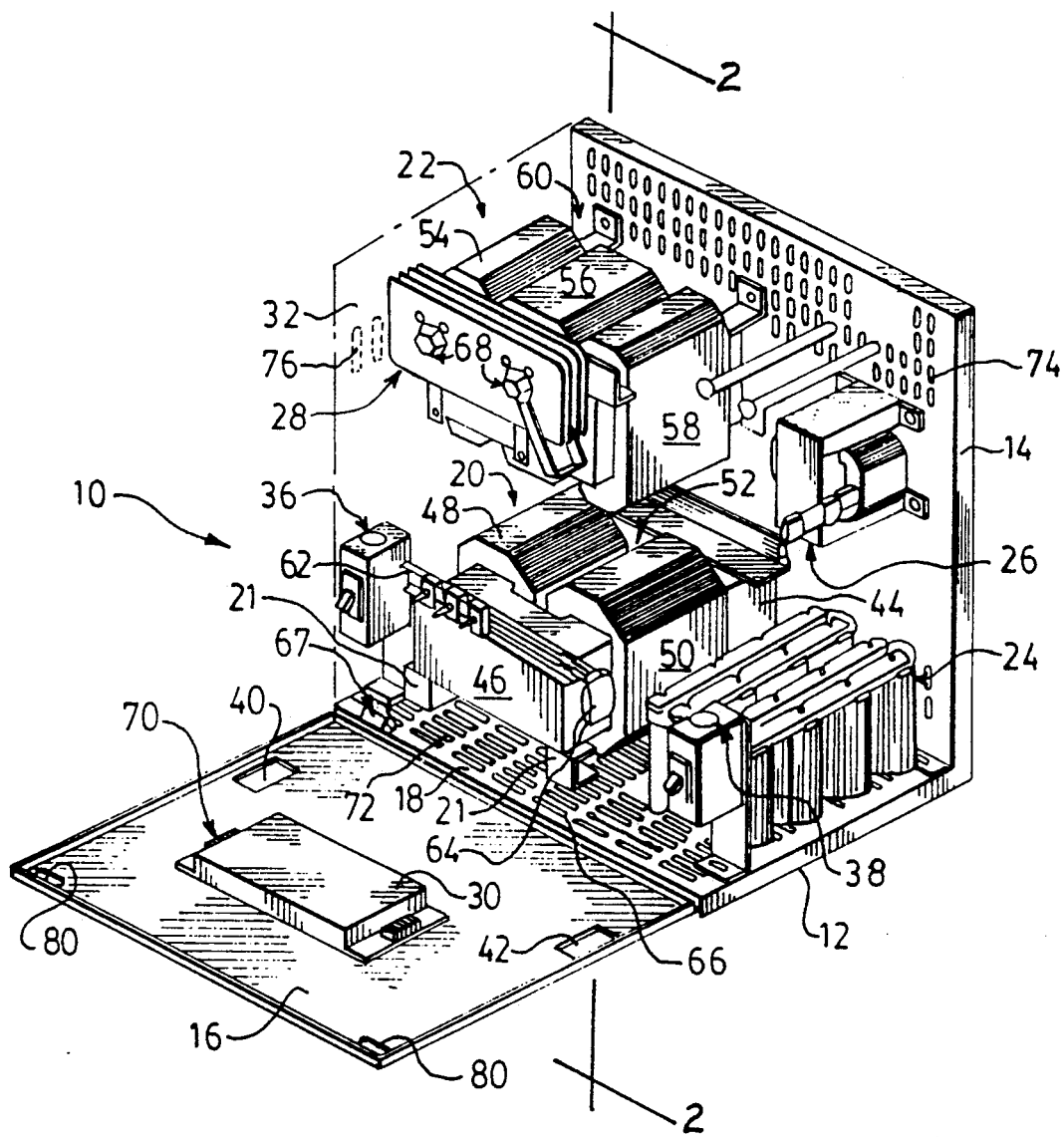
FIG. 1 is a perspective view of a typical single phase rectifier with the major components shown mounted as they would be in keeping with the present invention, but without the cabinet side walls and top wall.
Figure 2:
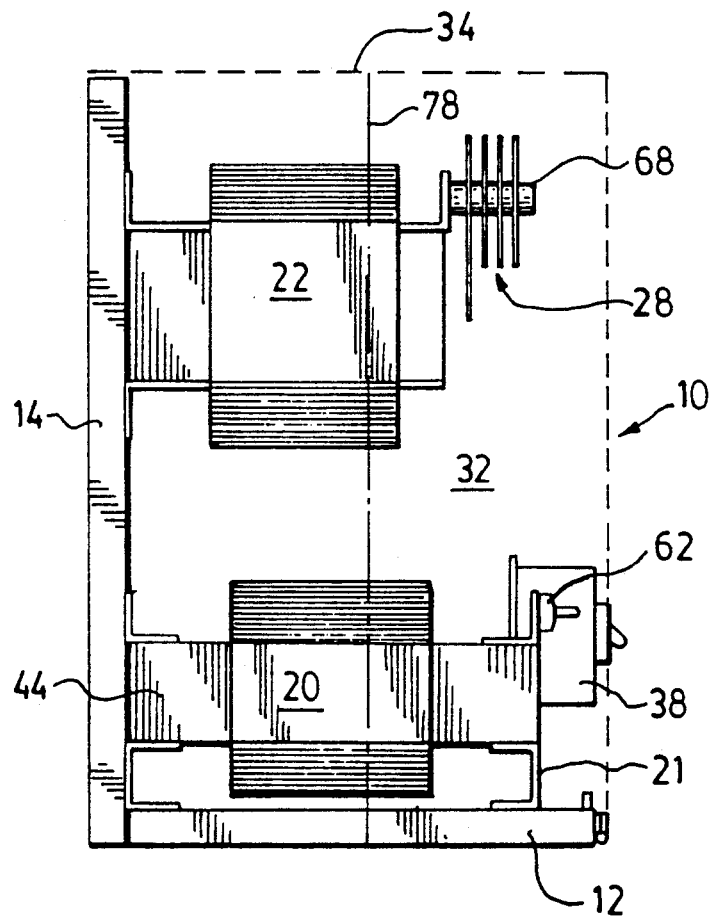
FIG. 2 is a side view of the structure of FIG. 1 taken in the direction of arrows 2—2 along the line indicated.

DESCRIPTION OF THE PREFERRED EMBODIMENTS:

An enclosure or chassis 10 is shown generally in FIGS. 1 and 2. The enclosure 10 has a horizontal base 12 and a vertical rear wall 14, the base 12 and rear wall 14 being secured to each other and being made of sheet metal of sufficient strength to serve the purposes intended. A front panel or door 16, which may be made of lighter gauge material than that of which the chassis members 12 and 14 are made, is hingedly connected along the front edge 18 of the horizontal base.

A number of typical components are shown mounted in the enclosure 10. They include an input transformer 20 and a saturable reactor 22. Other components may be a capacitor 24—the particular embodiment of the capacitor being outside the scope of the present invention, but usually a plurality of cylindrical electrolytic capacitors are used—a choke 26, input stacks diodes which may be mounted with cooling fins and are shown generally at 28, and a control or supervisory panel 30 which is mounted through a suitable opening in the front panel 16.

A side wall is shown in ghost lines at 32 in FIG. 1, and is indicated in FIG. 2. A top panel 34 is also indicated in FIG. 2; a further side wall which would be identical to side wall 32 is provided on the right side of the enclosure when facing the enclosure as in FIG. 1. The assembly of the top panel 34 and the side walls thus effectively forms a hood that may be easily installed.

It is usual for a single phase rectifier such as that indicated in FIGS. 1 and 2 to have two operating switches, a first switch 36 which turns on the incoming AC current and a second switch 38 which turns on the outgoing DC current. Switches 36 and 38 are conveniently toggle switches and are mounted so that they may be operated from outside the cabinet as the toggles extend through openings 40 and 42 in the front panel 16. The structure of the input transformer is such that it has a UI configuration. A UI-shaped core has two legs of which leg 44 is indicated in FIG. 1, extending forwardly from a rear leg which is mounted adjacent the rear wall 14. A front leg 46 is placed across the front of the UI-shaped core, and is interleaved as to its laminations with those of the two forwardly projecting legs. A pair of coils 48 and 50 is mounted on the UI-shaped core, one on each forwardly projecting leg. The front of the input transformer 20 is generally supported off the base 12 by legs 21.

The coils 48 and 50, and the legs of the U-shaped core, are all dimensioned so that an air gap 52 exists between the coils 48 and 50.

The saturable reactor 22 is similarily formed, but in that case it has an EI-shaped core upon which three coils 54, 56, and 58, are mounted. Once again, the coils 54, 56, and 58, and the legs of the EI-shaped core on which they are mounted, are all configured and dimensioned so as to assure that adequate air spaces 60 are formed between adjacent cores 54 and 56, and 56 and 58, respectively.

It will be noted that most of the components are mounted to the horizontal base 12 or the rear vertical wall 14; but some other components such as the diode stacks 28 together with their cooling fins are mounted, for example, to the saturable reactor 22, and an input terminal strip 62 is mounted to the input transformer 20.

It will be seen that all of the electrical connections are made at the front of the assembly. The incoming AC connections are made to the terminals on the terminal strip 62, and a connection is made through the switch 36; the outgoing DC connections may be made to the switch 38 on its negative side and a terminal post 64 at its positive side; and a ground connection for the DC (or AC) may be made at 66 or 67. The connections to the diodes are conveniently made at posts 68. Supervisory control connections may be made by a small wiring harness connected to the panel 30 at pad 70. This allows for easy maintenance, since connections are easily accessible from the front of the enclosure.

A plurality of cooling slots such as those indicated at 72 in the chassis base, and those indicated at 74 in the chassis rear wall, are provided. Additional cooling slots such as slots 76 in the side wall 32 are also provided; as well as cooling slots that may be formed in the top panel 34.

The enclosure 10 may be adapted for relay rack mounting by the provision of external mounting lugs such as that shown at 78 in FIG. 2.

As suggested above, the present invention has provided an enclosure for a single phase rectifier having relatively high KW rating (up to 125 amps at 48 volts DC) in an enclosure having a height of 17.5 inches compared with a similar prior art unit which has been provided in a cabinet having heights of 35 to 42 inches. Moreover, notwithstanding that there is dense component packing within the cabinet, there is efficient cooling; it has been found that the 17.5 inch high unit in fact operates cooler than the 42 inch high unit. A 30% lower temperature rise than previously achieved is typical in cabinet enclosures of the present invention.

By carefully choosing the materials used in the cores of the transformer 20 and the saturable reactor 22, the audible noise of the single phase rectifier may be minimal, —usually less than 50 dBA, which is essentially inaudible.

The assembly of a unit such as that illustrated in FIGS. 1 and 2 is very easily and efficiently completed. Most of the components, including especially the magnetic components, the diodes, the capacitors and the switches, can be mounted and secured in place before any inter-component wiring is made. In an assembly line operation, this assures fewer chances for error, because certain workers can be trained to mount specific components, and other workers can be trained to do the wiring after the components are fully mounted and secured in place. Thereafter, it is a simple matter of placing the side walls and top cover (as a hood) in place, and usually thereafter securing the front cover panel 16 in place using suitable fasteners placed through holes 80. Once it is assembled, then the single phase rectifier 20 may be put into service by simply opening the front cover, making the necessary AC and DC wiring connections at the front of the panel, re-closing the front panel, and closing the switches 36 and 38.

Obviously, it is possible to mount the saturable reactor 22 below the input transformer 20, provided that the fundamental principals of the present invention—the provision of adequate air spaces between the coils of the saturable reactor and the transformer so as to induce vertical cooling air flow through and past the saturable reactor and the input transformer—are followed. Moreover, it is generally provided that the principal magnetic components, the input transformer and the saturable reactor—especially the input transformer—are mounted and supported in such a way that they are substantially-free.

Indeed, in the usual embodiment of the present invention as described above, the mounting of the input transformer 20 by supporting it from the rear vertical wall 14 and its front from the base 12 is such that the structure of the input transformer 20 functions essentially as that gusset to add further structural strength to the chassis which is formed by the horizontal base 12 and the vertical rear wall 14. If the saturable reactor is mounted below the input transformer, similar provisions can be made for secure mounting and support of both the components.

In any event, the provision of adequate air spaces between the coils mounted on the forward projecting legs of each of the input transformer 20 and the saturable reactor 22 allows for confection flow of cooling air, thereby achieving lower temperature rise within the enclosure.

There has been described an enclosure design which can be assembled easily and efficiently, with much fewer chances for error, and with much greater component packing density although at the same time providing better cooling. Cooling is convection cooling, and there is no necessity for forced air cooling. There is considerably lower auditble noise from single phase rectifiers assembled in keeping with the present invention than previously has been possible.

The scope of the present invention is defined by the accompanying claims.

I claim:

1. An enclosure for a single phase rectifier having an input transformer, a saturable reactor, at least one capacitor, input diodes, and other circuit components; wherein all of said transformer, reactor, at least one capacitor, diodes, and other circuit components, are physically mounted in said enclosure for electrical connection; and wherein said enclosure comprises:

a chassis having a horizontal base and a vertical rear wall secured to each other so as to form a rigid two-sided frame, a door panel hingedly secured to the front edge of said horizontal base, and removable cabinet side walls and cabinet top cover arranged to be placed with said chassis and door panel so as to close said enclosure;

wherein said input transformer is securely mounted to said vertical rear wall horizontally above said horizontal base, and is formed with a UI-shaped core having two legs projecting forwardly from said rear wall with a transformer coil mounted on each leg, and an air space between said transformer coils;

wherein said saturable reactor is securely mounted horizontally to said vertical rear wall, and is formed with an EI-shaped core having three legs projecting forwardly from said rear wall with a reactor coil mounted on each leg, and an air space between adjacent reactor coils;

wherein said at least one capacitor is mounted on said horizontal base;

wherein all said other circuit components are secured to said chassis or to said transformer or said saturable reactor in such a manner that all electrical connections between all components of the single phase rectifier, and the input and output electrical connections to the single phase rectifier, are made at the front of said enclosure; and wherein cooling slots are provided in said horizontal base, said vertical rear wall, and at least one of said cabinet side walls and said cabinet top cover.

2. The enclosure of claim 1, wherein said cabinet side walls and said cabinet top cover are made of sheet material that is much lighter and thinner than the material from which said chassis base and rear wall are made.

3. The enclosure of claim 2, wherein said input transformer is mounted below said saturable reactor, and is supported at its front by support means on said horizontal base.

4. The enclosure of claim 2, wherein said cabinet side walls and said cabinet top cover are a unitary structure.

5. The enclosure of claim 2, wherein said input transformer is mounted above said saturable reactor, and said saturable reactor is supported at its front by support means on said horizontal base.

* * * * *